US007208389B1

(12) United States Patent
Tipton et al.

(10) Patent No.: US 7,208,389 B1
(45) Date of Patent: Apr. 24, 2007

(54) METHOD OF POROGEN REMOVAL FROM POROUS LOW-K FILMS USING UV RADIATION

(75) Inventors: Adrianne K. Tipton, Fremont, CA (US); Brian G. Lu, Fremont, CA (US); Patrick A. Van Cleemput, Sunnyvale, CA (US); Michelle T. Schulberg, Palo Alto, CA (US); Qingguo Wu, Tualatin, OR (US); Haiying Fu, West Linn, OR (US); Feng Wang, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/672,311

(22) Filed: Sep. 26, 2003

Related U.S. Application Data

(63) Continuation-in-part of application No. 10/404,693, filed on Mar. 31, 2003.

(60) Provisional application No. 60/469,433, filed on May 9, 2003.

(51) Int. Cl.
*H01L 21/76* (2006.01)

(52) U.S. Cl. ............................... 438/409; 257/E21.273
(58) Field of Classification Search .............. 438/446, 438/409; 257/E21.273
See application file for complete search history.

(56) References Cited

U.S. PATENT DOCUMENTS

| 4,357,451 A | 11/1982 | McDaniel |
| 4,882,008 A | 11/1989 | Garza et al. |
| 4,885,262 A | 12/1989 | Ting et al. |
| 5,504,042 A | 4/1996 | Cho et al. ................... 438/781 |
| 5,686,054 A | 11/1997 | Barthel et al. |
| 5,700,844 A | 12/1997 | Hedrick et al. |
| 5,789,027 A | 8/1998 | Watkins et al. |
| 5,849,640 A | 12/1998 | Hsia et al. |
| 5,851,715 A | 12/1998 | Barthel et al. |
| 5,858,457 A | 1/1999 | Brinker et al. .............. 427/126 |

(Continued)

FOREIGN PATENT DOCUMENTS

WO     WO95/07543     3/1995

OTHER PUBLICATIONS

Cho et al., "Plasma Treatments of Molecularly Templated Nanoporous Silica Films," Electrochemical and Solid-State Letters, 4 (4) G35-G38 (2001).

(Continued)

*Primary Examiner*—W. David Coleman
(74) *Attorney, Agent, or Firm*—Beyer Weaver & Thomas, LLP

(57) ABSTRACT

Methods of preparing a porous low-k dielectric material on a substrate are provided. The methods involve the use of ultraviolet radiation to react with and remove porogen from a porogen containing precursor film, leaving a porous low-k dielectric matrix. Methods using oxidative conditions and non-oxidative conditions are described. The methods described may be used to remove porogen from porogen-containing precursor films. The porogen may be a hydrocarbon such as a terpene (e.g., alpha-terpinene) or a norbornene (e.g., ENB). The resulting porous low-k dielectric matrix can then be annealed to remove water and remaining silanols capped to protect it from degradation by ambient conditions, which methods will also be described.

38 Claims, 7 Drawing Sheets

U.S. PATENT DOCUMENTS

| | | | |
|---|---|---|---|
| 5,920,790 | A | 7/1999 | Wetzel et al. |
| 6,140,252 | A | 10/2000 | Cho et al. |
| 6,177,329 | B1 | 1/2001 | Pang |
| 6,258,735 | B1 | 7/2001 | Xia et al. |
| 6,268,276 | B1 | 7/2001 | Chan et al. |
| 6,270,846 | B1 | 8/2001 | Brinker et al. ............ 427/385.5 |
| 6,271,273 | B1 | 8/2001 | You et al. ....................... 521/61 |
| 6,312,793 | B1 | 11/2001 | Grill et al. |
| 6,329,017 | B1 | 12/2001 | Liu et al. |
| 6,329,062 | B1 | 12/2001 | Gaynor |
| 6,340,628 | B1 | 1/2002 | Van Cleemput et al. |
| 6,365,266 | B1 | 4/2002 | MacDougall et al. .... 428/304.4 |
| 6,383,466 | B1 | 5/2002 | Domansky et al. ......... 423/335 |
| 6,383,955 | B1 | 5/2002 | Matsuki et al. |
| 6,386,466 | B1 | 5/2002 | Ozawa et al. |
| 6,387,453 | B1 | 5/2002 | Brinker et al. .............. 427/387 |
| 6,391,932 | B1 | 5/2002 | Gore et al. |
| 6,392,017 | B1 | 5/2002 | Chandrashekar |
| 6,420,441 | B1 | 7/2002 | Allen et al. .................... 521/77 |
| 6,444,715 | B1 * | 9/2002 | Mukherjee et al. ........... 521/64 |
| 6,479,374 | B1 | 11/2002 | Ioka et al. |
| 6,500,770 | B1 | 12/2002 | Cheng et al. |
| 6,548,113 | B1 | 4/2003 | Birnbaum et al. |
| 6,573,030 | B1 | 6/2003 | Fairbairn et al. |
| 6,576,345 | B1 | 6/2003 | Cleemput et al. |
| 6,596,467 | B2 | 7/2003 | Gallagher et al. |
| 6,596,654 | B1 | 7/2003 | Bayman et al. |
| 6,610,362 | B1 | 8/2003 | Towle |
| 6,632,478 | B2 | 10/2003 | Gaillard et al. |
| 6,667,147 | B2 | 12/2003 | Gallagher et al. |
| 6,677,251 | B1 | 1/2004 | Lu et al. |
| 6,715,498 | B1 | 4/2004 | Humayun et al. |
| 6,756,085 | B2 | 6/2004 | Waldfried et al. |
| 6,797,643 | B2 | 9/2004 | Rocha-Alvarez et al. |
| 6,805,801 | B1 | 10/2004 | Humayun et al. |
| 6,812,043 | B2 | 11/2004 | Bao et al. |
| 6,815,373 | B2 | 11/2004 | Singh et al. |
| 6,831,284 | B2 | 12/2004 | Demos et al. |
| 6,846,380 | B2 | 1/2005 | Dickinson et al. |
| 6,848,458 | B1 | 2/2005 | Shrinivasan et al. |
| 6,914,014 | B2 | 7/2005 | Li et al. |
| 2002/0001973 | A1 | 1/2002 | Wu et al. |
| 2002/0034626 | A1 | 3/2002 | Liu et al. |
| 2002/0106500 | A1 | 8/2002 | Albano et al. |
| 2002/0123240 | A1 | 9/2002 | Gallagher et al. |
| 2002/0192980 | A1 | 12/2002 | Hogle et al. |
| 2003/0064607 | A1 | 4/2003 | Leu et al. |
| 2003/0119307 | A1 | 6/2003 | Bekiaris et al. |
| 2003/0157248 | A1 | 8/2003 | Watkins et al. |
| 2003/0198895 | A1 | 10/2003 | Toma et al. |
| 2004/0069410 | A1 | 4/2004 | Moghadam et al. |
| 2004/0096586 | A1 | 5/2004 | Schulberg et al. |
| 2004/0096593 | A1 | 5/2004 | Lukas et al. |
| 2004/0096672 | A1 * | 5/2004 | Lukas et al. ................. 428/446 |
| 2004/0099952 | A1 | 5/2004 | Goodner et al. |
| 2004/0101633 | A1 | 5/2004 | Zheng et al. |
| 2004/0102031 | A1 | 5/2004 | Kloster et al. |
| 2004/0161532 | A1 | 8/2004 | Kloster et al. |
| 2004/0170760 | A1 | 9/2004 | Meagley et al. |
| 2004/0185679 | A1 | 9/2004 | Ott et al. |
| 2005/0064698 | A1 | 3/2005 | Chang et al. |

OTHER PUBLICATIONS

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure To Oxidizing Environments," U.S. Appl. No. 10/056,926, filed Jan. 24, 2002, 34 Pages.

Gangpadhyay et al., "The First International Surface Cleaning Workshop," Northeastern University, Nov. 11-14, 2002.

Jan, C.H., et al, *90NM Generation, 300mm Wafer Low k ILD/Cu Interconnect Technology*, 2003 IEEE Interconnect Technology Conference.

Wu et al., U.S. Appl. No. 10/789,103, entitled: Methods For Producing Low-K Cdo Films With Low Residual Stress.

Wu et al., U.S. Appl. No. 10/820,525, entitled: Methods For Producing Low-K Cdo Films With Low Residual Stress.

Wu et al., U.S. Appl. No. 10/800,409, entitled: Methods For Producing Low-K CDO Films.

U.S. Appl. No. 10/016,017, filed Dec. 12, 2001.

U.S. Appl. No. 10/125,614, filed Apr. 18, 2002.

U.S. Appl. No. 10/202,987, filed Jul. 23, 2002.

Humayun et al., "Method For Forming Porous Films By Porogen Removal Combined With In Situ Modification", U.S. Appl. No. 10/404,693, filed Mar. 31, 2003, Office Action dated Mar. 15, 2005.

Tipton et al., "Method For Removal Of Porogens From Porous Low-K Films Using Supercritical Fluids", U.S. Appl. No. 10/372,305, Office Action dated Mar. 22, 2005.

Humayun et al., "Method for Forming Porous Films By Porogen Removel Combined Wtih In SITU Surface Modification", Novellus Corporation, U.S. Appl. No. 10/404,693, filed Mar. 31, 2003, pp. 1-32.

Tipton et al., "Method for Removal of Porogens From Porous Low-K Films Using Supercritical Fluids", Novellus Systems, Inc., U.S. Appl. No. 10/672,305, filed Sep. 26, 2003, pp. 1-32.

Cho et al., "Method and Apparatus for UV Exposure of Low Dielectric Constant Materials for Porogen Removal and Improved Mechanical Properties", Novellus Systems, Inc., Appl. No. 10/800,377, filed Mar. 11, 2004, pp. 1-31.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

Bandyopadhyay et al., "Method to Improve Mechanical Strength of Low-K Dielectric Film Using Modulated UV Exposure", U.S. Appl. No. 10/825,888, filed Apr. 16, 2004.

R.D. Miller et al., "Phase-Separated Inorganic-Organic Hybrids for Microelectronic Applications," MRS Bulletin, Oct. 1997, pp. 44-48.

Jin et al., "Nanoporous Silica as an Ultralow-$k$ Dielectric," MRS Bulletin, Oct. 1997, pp. 39-42.

Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.

Asoh et al., "Conditions for Fabrication of Ideally Ordered Anodic Porous Alumina Using Pretextured AI," Journal of the Electrochemica Society, 148 (4) B152-B156 (2001) pp. B152-B156.

Holland et al., "Nonlithographic Technique for the Production of Large Area High Density Gridded Field Sources," J. Vac. Sci. Technol. B 17(2), Mar./Apr. 1999, pp. 580-582.

Masuda et al. "Highly Ordered Nanochannel-Array Architecture in Anodic Alumina," App. Phys. Lett. 71(19), Nov. 1997, pp. 2770-2772.

Clube et al., White Paper from Holotronic Technologies SA; downloaded from www.hdotronic.com/whitepaper/fine-patt.pdf on Mar. 12, 2002.

Meli et al., "Self-Assembled Masks for the Transfer of Nanometer-Scale Patterns into Surfaces: Characterization by AFM and LFM", Nano Letters, vol. 2, No. 2, 2002, 131-135.

"Shipley Claims Porous Low K Dielectric Breakthrough," Press Release Mar. 17, 2003.

Jeffrey M. Calvert and Michael K. Gallagher, Semiconductor International, 26 (12), 56 (2003).

Van Bavel et al., Future Fab International, 16, (2004).

Caluwaerts et al, "Post Patterning Meso Porosity Creation: A Potential Solution For Pore Sealing," IITC 2003.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Varadarajan et al., "Strained Transistor Architecture and Method", Novellus Systems, Inc., U.S. Appl. No. 10/923,259, filed Aug. 20, 2004, pp. 1-24.

Niu et al., "Methods For Improving The Cracking Resistance Of Low-K Dielectric Materials", U.S. Appl. No. 10/860,340, filed Jun. 2, 2004.

Niu et al., "Methods For Improving The Cracking Resistance Of Low-K Dielectric Materials", U.S. Appl. No. 10/860,340, Office Action dated Mar. 2, 2004.

Niu et al., "Methods For Improving The Cracking Resistance Of Low-K Dielectric Materials", U.S. Appl. No. 10/860,340, Final Office Action dated June 13, 2005.

Wang et al., "Plasma Detemplating And Silanol Capping Of Porous Dielectric Films", U.S. Appl. No. 10/785,235, filed Feb. 23, 2004.

Varadarajan et al., "Tensile Dielectric Films Using UV Curing", U.S. Appl. No. 10/972,084, filed Oct. 22, 2004.

Fox et al., "Method For Improving Mechanical Properties Of Low Dielectric Constant Materials", U.S. Appl. No. 10/849,568, filed May 18, 2004.

Fox et al., "Method For Producing Low-Stress Carbon-Doped Oxide Films With Improved Integration Properties", U.S. Appl. No. 10/987,208, filed Nov. 12, 2004.

Van Den Hoek et al., "VLSI Fabrication Processes For Introducing Pores Into Dielectric Materials," U.S. Appl. No. 11/050,621, filed Jan. 31, 2005.

Draeger et al., "Creation Of Porosity In Low-K Films By Photo-Disassociation Of Imbedded Nanoparticles," U.S. Appl. No. 11/146,456, filed Jun. 6, 2005.

Wu et al., "Methods For Producing Low Stress Porus Low-K Dielectric Materials Using Precursors With Organic Functional Groups", U.S. Appl. No. 10/927,777, filed Aug. 27, 2004.

Wu et al., "Methods For Improving Integration Performance Of Low Stress CDO Films", U.S. Appl. No. 10/941,502, filed Sep. 14, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S Office Action mailed Sep. 1, 2005, from U.S. Appl. No. 10/672,305.

U.S. Office Action mailed Aug. 27, 2005, from U.S. Appl. No. 10/404,693.

U.S. Office Action mailed Jul. 27, 2005, from U.S. Appl. No. 10/785,235.

Cho et al., "Method for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.

U.S. Office Action mailed Dec. 20, 2005, from U.S. Appl. No. 10/849,568.

U.S. Office Action mailed Jan. 9, 2006, from U.S. Appl. No. 10/785,235.

U.S. Office Action mailed Dec. 27, 2005, from U.S. Appl. No. 10/789,103.

U.S. Office Action mailed Dec. 23, 2005, from U.S. Appl. No. 10/800,409.

U.S. Office Action mailed Feb. 7, 2006, from U.S. Appl. No. 10/672,305.

Subramonium et al., "Pulsed PECVD Method for Modulating Hydrogen Content in Hard Mask", U.S. Appl. No. 11/318,269, filed Dec. 23, 2005.

U.S. Office Action mailed Feb. 28, 2006, from U.S Appl. No. 10/404,693.

U.S. Office Action mailed Mar. 29, 2006, from U.S. Appl. No. 10/800,377.

* cited by examiner

METHOD OF POROGEN REMOVAL FROM POROUS LOW-K FILMS USING UV RADIATION

CROSS-REFERENCE TO RELATED APPLICATIONS

This application claims the benefit of U.S. Provisional Patent Application No. 60/469,433 filed May 9, 2003 naming Tipton et al. and titled "Method of Porogen Removal from Porous Low-K Films Using UV Irradiation," and this application is a continuation-in-part claiming priority under 35 USC 120 from U.S. patent application Ser. No. 10/404,693, filed on Mar. 31, 2003, titled "Method for Forming Porous Films by Porogen Removal Combined with In Situ Surface Modification," by Raashina Humayun et al. as inventors Both applications are incorporated herein by reference in their entireties for all purposes. This application is also related to U.S. patent application Ser. No. 10/672,305 filed on the same day as the instant application, titled "Method for Removal of Porogens from Porous Low-k Films Using Supercritical Fluids," by Adrianne Tipton et al. as inventors and to U.S. patent application Ser. No. 10/295,965 filed Nov. 15, 2002 by Schulberg, et al., and titled "System for Deposition of Mesoporous Materials," which applications are incorporated herein by reference in its entirety for all purposes.

FIELD OF THE INVENTION

This invention relates to methods for preparing porous films using porogen technology. More specifically, the methods involve the deposition of a precursor film followed by removal of the porogen from a precursor film by using ultra violet radiation. The resulting porous film can be used as low-k dielectric layer in integrated circuits.

BACKGROUND

There is a general need for materials with low dielectric constants (low-k) in the integrated circuit manufacturing industry. Using low-k materials as the intermetal and/or interlayer dielectric of conductive interconnects reduces the delay in signal propagation due to capacitive effects. The lower the dielectric constant of the dielectric, the lower the capacitance of the dielectric and the lower the RC delay of the IC.

Low k dielectrics are conventionally defined as those materials that have a dielectric constant lower than that of silicon dioxide, that is k<~4. Typical methods of obtaining low-k materials include doping silicon dioxide with various hydrocarbons or fluorine. These doping methods, however, generally cannot produce materials with dielectric constants lower than about 2.6. With more and more advanced technology needs, present efforts are focused on developing low-k dielectric materials with k less than 2.5. These ultra low-k dielectrics can be obtained by incorporating air voids within a low-k dielectric, creating a porous dielectric material.

Methods of fabricating porous dielectrics typically involve forming a composite film (sometimes referred to herein as a "precursor film") containing two components: a porogen (typically an organic material such as a polymer) and a structure former or dielectric material (e.g., a silicon containing material). Once the composite film is formed on the substrate, the porogen component is removed, leaving a structurally intact porous dielectric matrix. Techniques for removing porogens from the composite film include, for example, a thermal process in which the substrate is heated to a temperature sufficient for the breakdown and vaporization of the organic porogen. These thermal processes, however, have certain difficulties. In particular, substrate temperatures generally need to be high (i.e. greater than about 400 degrees Celsius) with exposure times typically on the order of hours. As is well known in the field, these conditions can damage copper containing devices.

What are needed therefore are improved methods for removing porogen to form porous films.

SUMMARY

The present invention addresses this need by providing improved methods of preparing a low-k dielectric material on a substrate. In particular, methods involve (a) forming a precursor film that contains a porogen and a structure former on a substrate, and (b) exposing the precursor film to ultra-violet radiation (UV) to remove the porogen and thereby form a porous low-k dielectric material. In some embodiments, the UV exposure occurs in an inert atmosphere. In these embodiments, the porogen chemically interacts with UV radiation to chemically break down into a material that is easily removed from the precursor layer to leave behind a porous low-k dielectric film. In one example, the UV treatment converts the porogen to volatile hydrocarbons, which can be removed by heat and/or low pressure.

In other embodiments, the ultraviolet radiation exposure occurs in an oxygen-containing atmosphere. The UV radiation interacts with the oxygen to produce ozone and/or oxygen radicals that can oxidize the porogen. The reaction products of porogen oxidation are driven from the substrate, leaving a porous low-k dielectric film. Note that in these embodiments porogen decomposition may result in part from direct interaction with the UV radiation.

The precursor film is preferably formed by co-depositing the porogen with the structure former. Preferably, the porogen is an organic material and the structure former is a silicon-containing material. In preferred embodiments, the structure former is produced from a silane, an alkylsilane, an alkoxysilane or a siloxane. Examples of suitable siloxanes include octamethyl cyclotetrasiloxane (OMCTS) and tetramethylcyclotetrasiloxane (TMCTS).

One preferred class of porogen compounds is the polyfunctional cyclic non-aromatic compounds. Good examples of such compounds are the alpha-terpinene (ATRP) compounds. Additional preferred porogen compounds will include compounds with multiple reactive sites, such as —CH=CH$_2$, —CH=CH—, —C≡CH, —C≡C—, —C=O, —OCH$_3$. Typical examples of these compounds are 1,2,3,4-tetramethyl-1,3-cyclopentadiene (TMCP) (C$_9$H$_{14}$) and 5-ethylidene-2-norbornene (ENB) (C$_9$H$_{12}$). Another class of porogen is the template forming compounds such as certain block copolymer materials, such as polyethylene oxide (PEO)-polypropylene oxide (PPO) block copolymers, used to form ordered mesoporous films. In a somewhat different approach, the porogen and structure former exist in the same precursor molecule. After creating a precursor layer of such material, the layer is treated to remove the porogen from the composition, while leaving the structure former. Examples of these types of compounds are various organic silanes, such as di-tert-butyl-silane, that possess bulky organic groups. The tert-butyl group can be driven from the deposited silicon-oxygen matrix to leave behind small pores. Additional examples include 5-(bicycloheptenyl)methyldimethoxysilane (BMDS) ($SiC_{10}O_2H_{18}$), 5-(bicycloheptenyl)triethoxysilane (BTS) ($SiC_{13}O_3H_{24}$).

The precursor film can be formed using a CVD process (e.g., a plasma enhanced chemical vapor deposition (PECVD) technique), a spin-on process, or another condensed phase method. UV wavelengths, exposure time and intensity depend on a number of factors, including the thickness of the precursor layer and the type of porogen and structure formers used. In cases of UV exposure in the presence of oxygen, the wavelengths appropriate for producing ozone and/or oxygen radicals are used. Substrate temperatures will vary broadly during the UV exposure. Suitable substrate temperatures may range between about 25 and 450 degrees Celsius, more preferably between about 60 and 400 degrees Celsius.

In preferred embodiments, once the porogen is removed from the precursor film, an anneal and/or a silanol capping post-treatment may be performed. The anneal process may be used to remove water that may have formed on the substrate after porogen removal. The silanol capping post-treatment can tie up hydroxyl species that may have formed during the porogen removal process. In a preferred embodiment, HMDS is used as a silanol capping agent. Alternatively, the silanol capping agent may be selected from the group consisting of disilazanes, chlorosilanes, aldehydes, and combinations thereof.

These and other features and advantages of the invention will be described in detail below with reference to the associated drawings.

BRIEF DESCRIPTION OF THE DRAWINGS

The following detailed description can be more fully understood when considered in conjunction with the drawings in which.

DETAILED DESCRIPTION OF A PREFERRED EMBODIMENT

Introduction

Figure 1:
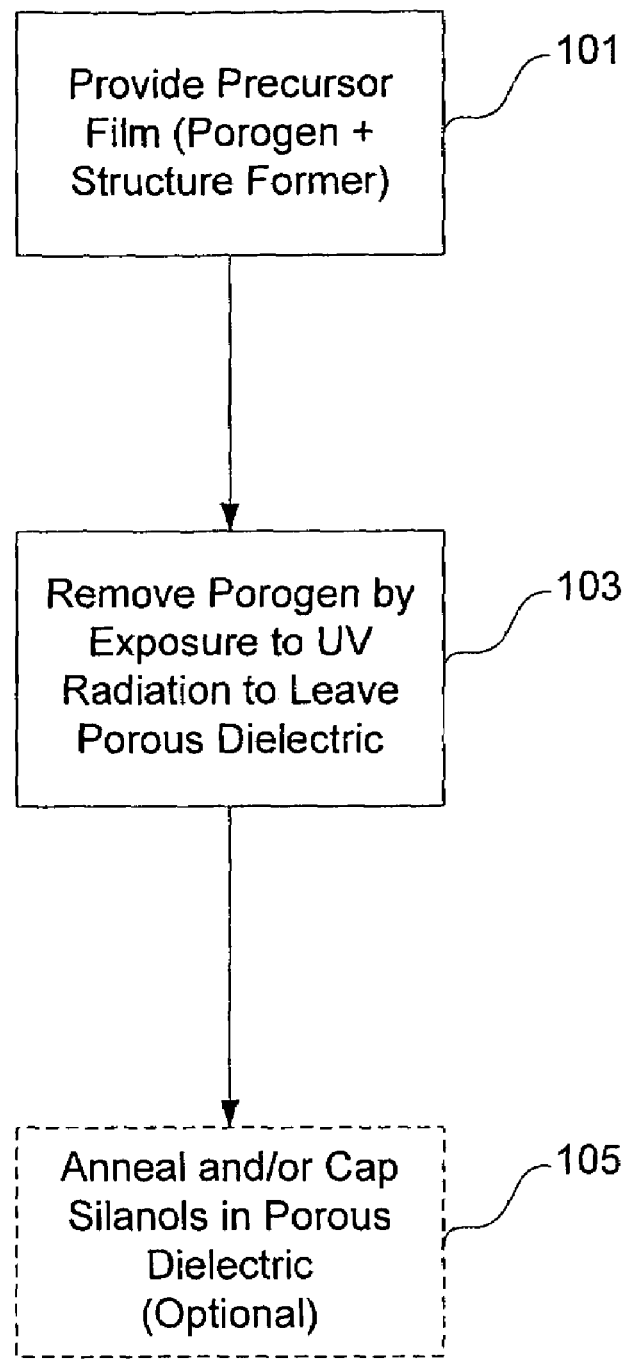
FIG. 1 is a flowchart summarizing stages of a general process and two preferred implementations of the invention.

In the following description, numerous specific details are set forth in order to provide a thorough understanding of the present invention, which pertains to porogen removal of a porous precursor film. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

The present invention involves forming a low-k dielectric material by way of a "precursor film" or "precursor layer" that contains a "structure former," typically a dielectric material, which serves as a backbone of the porous network, and a porogen, which generates the porous regions within the porous network. Hence, the porogen and dielectric matrix typically exist as separate phases within the precursor layer. In methods of this invention, the porogen is removed from the precursor film to create a porous low-k dielectric layer. Within the precursor film, the porogen resides in locations that will subsequently become void locations in the final dielectric film.

The precursor film may be formed by any of numerous techniques. In some methods, the structure former and porogen are co-deposited in one process. Any suitable deposition technique may be used, including spin-coating processes, print-on, dip coating, thermal process and chemical vapor deposition—particularly plasma enhanced chemical vapor deposition (PECVD). In alternative methods, the structure former and porogen are deposited separately in a two-phase process. For example, in some mesoporous films, a template-forming precursor, solvent and catalyst are mixed and applied by spin-coat or print-on methods to form a template in a first process phase, then a silica-forming precursor is introduced to the formed template in a second process step such as supercritical infusion into a polymer matrix. Depending on the application, the thickness of the precursor film may range between about 30 nanometers and 3 micrometers.

Generally, a porogen is any removable material that defines void regions in a dielectric matrix. Frequently, though not necessarily, the porogen is an organic material. In methods of the present invention, the porogen is removed from the precursor film by a UV mediated method. In a first approach, the UV light directly interacts with the porogen to chemically decompose or otherwise modify the porogen and produce products that are more easily removed than the porogen itself. In another approach, the UV exposure occurs in the presence of oxygen to create an oxidizing environment (e.g., ozone and/or oxygen radicals) that oxidizes the porogen. The oxidation products are more easily removed than the porogen itself. Note that in this approach, some UV radiation may interact directly with the porogen as well. In general, the UV radiation is tuned for absorption by the porogen in the first approach and tuned for oxygen activation in the second approach. Thus, in the first approach, the UV radiation preferably has a high intensity component at a wavelength (or range of wavelengths) at or near an absorption peak of the porogen. Of course, the porogen may be chosen to match the characteristics of an available UV source.

In some cases the porogen is randomly distributed throughout the precursor film and other cases it is ordered in a repeating structure throughout the film. In the case of an ordered porous or mesoporous dielectric matrix, the porogen is frequently referred to as a "template." One type of ordered porogen, for example, is a block copolymer that has chemically distinct components (e.g. PEO polyethylene oxide and PPO polypropylene oxide) that segregate into separate phases. The discussion herein will refer to porogen and porogen materials in general and are intended to include any type of porogen, ordered or non-ordered, organic or inorganic, unless otherwise specified.

Frequently, the porogen is a hydrocarbon. The following is a non-comprehensive list of precursor films (listed by type of porogen molecules) suitable for the present invention. "Low temperature porogens" are deposited below about 200 degrees C. and "high temperature porogens" are deposited above about 200 degree C.

| Low Temperature Porogens | High Temperature Porogens |
| --- | --- |
| Aldehydes: CH2O, CH3CHO | Alkenes: C2H4, CH3—CH=CH2, etc |
| Alkenes: C2H4, CH3—CH=CH2, etc | Terpene family compounds (e.g. alpha-terpinene) |
| di-tert-butyl silane | Terpene derivatives (such as terpinol) |
| Esters | Compounds with multiple active sites (e.g., ENB) |

One preferred class of porogens is the polyfunctional cyclic non-aromatic compounds, particularly alpha-terpinenes (ATRP). Suitable alpha-terpinene derivatives include, for example, alpha-terpinene itself, substituted alpha-terpinenes, and multi-ring compounds containing the alpha-terpinene nucleus. Other compounds include functional groups such as —CH=CH$_2$, —CH=CH—, —C≡CH, —C≡C—, —C=O, —OCH$_3$. A typical example of these compounds is 1,2,3,4-tetramethyl-1,3-cyclopentadiene (TMCP) (C$_9$H$_{14}$). Three-dimensional multi-ring compounds such as 5-ethylidene-2-norbornene (ENB) are also suitable.

In some cases, the porogen and structure former reside in the same compound. That is, the porogen is a removable moiety in a compound that contains moieties serving as structure formers covalently bonded to moieties serving as the porogen. Nominally, the porogen moiety is a large bulky organic substituent that will leave pores in the resulting dielectric film. Examples of such species are organic silanes such as di-tert-butylsilane, phenyldimethylsilane, and alkoxysilanes such as 5-(bicycloheptenyl)methyldimethoxysilane (BMDS) and 5-(bicycloheptenyl)triethoxysilane (BTS) (SiC$_{13}$O$_2$H$_{24}$). These compounds may be deposited using CVD or spin on methods, for example.

As indicated, the structure former serves as a backbone for the resulting porous low-k film. Many different chemical compositions may be used as the structure former. In some embodiments, the composition includes silicon and oxygen. Sometimes it also includes carbon and/or other elements and even metals. For relatively thick precursor layers, it will sometimes be desirable to use structure formers that are not opaque to the UV radiation.

Examples of precursors for structure formers include silanes, alkylsilanes (e.g., trimethylsilane and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes and cyclic siloxanes (e.g. octamethylcyclotetrasiloxane (OMCTS) and tetramethylcyclotetrasiloxane (TMCTS)). Note that one example of a silane is di-tert-butylsilane, described above.

The thickness of the precursor film (and hence the resulting dielectric layer) depends upon the ultimate application. As an example, the thickness may range between about 50 to 1500 angstroms for a hard mask application. For an interlayer dielectric or packaging application, the thickness may range up to about 2 to 3 microns. In some cases, extra thickness is required to provide some amount of sacrificial dielectric to accommodate a subsequent planarization step. In some cases, the thickness of the precursor layer may be driven in part by the ability of the UV radiation to penetrate the film and remove the porogen. Therefore relatively thinner precursor layers may be required for some processes.

It will be appreciated by those skilled in the art that the UV radiation used with the invention encompasses near-UV, as well UV wavelengths. Thus, the radiation used to facilitate porogen removal in accordance with this invention may have wavelengths ranging between about 156 and 500 nanometers. As indicated, the UV wavelength(s) should match the absorption characteristics of the porogen bonds to be broken and/or the oxidizing agent, if used. Common bonds to be targeted which contribute to the overall absorption characteristics of the porogen-containing film are Si—CH$_3$, C—C, C=C and C—H. For example, ATRP has an absorption peak at approximately 250 nanometers; therefore, a UV source intended to interact directly with a film containing ATRP preferably has high intensity components in the range of about 220 to 285 nanometers. Note that the radiation may comprise a narrow range of wavelengths (e.g., most intensity exits in a band of about 1 to 20 nanometers) or a broader range of wavelengths.

FIG. 1 is a flow chart depicting one general high-level process flow in accordance with an embodiment of the present invention. Initially, a precursor film is provided on a substrate as indicated by a process block 101. As mentioned previously, a precursor film contains a porogen and a structure former for the dielectric backbone.

As described above, various techniques for forming a precursor film may be employed. A typical approach involves co-depositing the porogen with the structure former precursor using a low temperature PECVD (plasma enhanced chemical vapor deposition) process. As indicated, other processes such as high temperature chemical vapor deposition methods and spin on methods may be employed. Other suitable deposition techniques may include supercritical infusion, print-on, and dip coating. It is noted again that the invention is not limited to any particular type of deposition method.

Next, the precursor film is exposed to UV radiation to mediate removal of at least a portion of the porogen to leave a porous dielectric film, 103. As indicated, the UV light can directly interact with porogen bonds and thereby facilitate its decomposition or other breakdown mechanism. In a typical case, the porogen decomposes into lower molecular weight components that exist in the vapor phase or can be easily vaporized and thereby removed from the precursor film. Alternatively the UV radiation can indirectly facilitate breakdown of the porogen. In one example, this is accomplished by the UV radiation interacting with a compound other than the porogen to convert that compound into a species that can attack the porogen and thereby facilitate its removal. For example, the UV radiation may convert molecular oxygen or other oxygen containing compounds present in a reaction chamber to produce a strong oxidant, which can then react with and break down the porogen. Again, the decomposition products of the porogen can be volatilized and removed from the precursor film.

Note that the operations 101 and 103 can be conducted in a single vessel or in two separate vessels, one for forming the precursor layer and another for exposing the porogen to UV radiation or a UV activated species. Also, it is possible for a wafer to be treated in this manner in one chamber and then moved to a different chamber where the decomposed porogen is removed by heating, contact with a solvent, etc. In general, however, for mechanical simplicity, it is preferred to perform as many operations as possible in a single chamber.

Referring back to FIG. 1, after the porogen is removed, the next operation is an optional anneal and/or silanol capping process. See block 105. If both anneal and silanol capping processes are employed, in preferred embodiments the anneal process takes place prior to the silanol capping process or the two processes take place simultaneously. One or both processes can be used to stabilize the porous dielectric after porogen removal.

An anneal process is a thermal process to vaporize unwanted components such as water that may have formed on the substrate after porogen removal, to remove less volatile porogen decomposition products and/or to enhance mechanical strength of film. Anneal temperatures generally range between about 100 and 450 degrees C. and exposure times typically range between about 30 seconds and 600 minutes in most cases.

During the porogen removal process hydroxyl groups (—OH) can form within the dielectric matrix. These polar groups can significantly increase the dielectric constant, k, of the film. When the substrate is exposed to ambient, the hydroxyl groups will interact with moisture and trap water in the dielectric matrix, further increasing k. A silanol capping process addresses this issue by replacing the hydroxyl groups with non-polar groups (e.g., alkyl groups), thereby rendering the film hydrophobic and allowing it to maintain a low overall dielectric constant, even when exposed to ambient moisture. Note that the term "silanol capping" as used herein will refer broadly to any process that involves replacing or "protecting" hydroxyl groups within the film. Silanol capping agents can also tie up "dangling bonds," reactive unpaired valence electrons, which likewise have a strong affinity for water. In some cases, this silanol capping may be effective to further lower the dielectric constant of the porous dielectric material or protect the dielectric from degradation due to subsequent exposure to ambient conditions, and particularly contact with water. Various silanol capping agents can be used including, for example, disilazanes (e.g., hexamethyldisilazane (HMDS)), chlorosilanes, aldehydes, and combinations thereof.

Preferably, though not necessarily, the silanol capping and anneal operations are performed (if both are in fact performed) in a single vessel. In some embodiments, the UV porogen removal, the anneal and silanol capping post-treatment processes can all take place in the same reactor or they may occur at different stations in a multi-station tool. Aspects of a suitable apparatus configuration will be presented below.

In operation, 103, the UV source employed may be of any type, including lasers and lamps. Examples of lamps include a mercury lamp and a xenon arc lamp. These generally emit UV radiation over a relatively wide range of wavelengths. Lasers, on the other hand, typically emit UV radiation at a single wavelength or a very narrow band of wavelengths. Examples of lasers include excimer lasers and tunable variations. In the reactor, the UV radiation should be directed onto the wafer. Various lenses, filters, and other optical elements may be employed for this purpose. In some embodiments, the optical elements will expand a beam of UV light to cover an entire wafer. In other embodiments, the UV radiation will form a line or patch that illuminates only a portion of the wafer. In such cases, the light and the wafer can be moved with respect to one another to ensure that the whole wafer surface is illuminated over a relatively short period of time. In a particular embodiment, a thin strip of light from a laser or other source is directed onto the wafer. Then the wafer and the strip of light are moved with respect to one another to ensure that the entire wafer is illuminated. An example of a suitable apparatus in accordance with the invention will be presented below.

The substrate temperature should be chosen to ensure that porogen is efficiently removed during or after the UV treatment. In general, temperatures below about 450 degrees C. are preferable, more preferably $\leq 400$ degrees C., as higher temperatures can damage a partially fabricated device, particularly one that employs copper lines. Typical temperatures range between about room temperature (i.e., 20 degrees C.) up to 450 degrees C. It should be noted that exposure to UV radiation can itself contribute to substrate heating.

Chamber pressures also can range broadly depending on the porogen and the nature of the UV treatment. For example, appropriate pressures may span a range of between about $10^{-6}$ Torr (high vacuum) to 1000 Torr. In the higher pressure ranges, it is important to ensure that moisture, oxygen, or any other undesirable species is kept out of the chamber, with the exception of processes that may want ozone or excited oxygen. In a more preferred pressure range when using inert gas, the pressure ranges from about 5 to 1000 mTorr.

UV exposure time is largely a function of both the lamp intensity and the density of the precursor layer including porogen and structure former. UV exposure times range from seconds to tens of hours. Preferably, for commercial applications, the exposure time will be about 5 minutes or less. In a preferred embodiment, the exposure time ranges from about 1 second up to 5 minutes.

As indicated the UV radiation may directly interact with the porogen or it may generate a reactive species that in turn attacks the porogen. If the exclusive mechanism is direct interaction, then the porogen removal operation is preferably performed an inert environment. This may be a vacuum, a noble gas atmosphere (e.g., argon, helium, and/or xenon), a nitrogen atmosphere, etc. In some embodiments, a quantity of hydrogen gas is used as well. If reactive species are to be generated, then the atmosphere could include oxygen, $N_2O$, $CO_2$, $NO_2$ or a combination thereof. When exposed to UV radiation, molecular diatomic oxygen forms less stable but more aggressive oxidizing species such as ozone and oxygen radicals. The ozone and oxygen radicals are sufficiently strong oxidizing agents to oxidize the organic porogen. The porogen is then removed in the form of small volatile hydrocarbon molecules and oxygen containing species. Additional gases during UV exposure for porogen removal could include F-containing species. F radicals generated during UV exposure react and decompose CH compounds in the film. Examples of this class of gases include $C_2F_6$, $C_3F_8$, $NF_3$, etc.

Note that strong oxidizers such as ozone and oxygen radicals attack the porogen and the dielectric surface non-selectively. Hence, embodiments that employ oxidizing environments tend to leave dangling bonds and —Si—OH groups on the dielectric surface, thereby leaving the dielectric matrix more susceptible to water absorption. Conversely, in embodiments employing direct UV attack, the wavelengths of the UV radiation can be tuned to a point that selectively removes the porogen but does not strip off methyl and other organic groups that protect the surface of the silicon containing dielectric. Therefore treatments employing oxidizing environments are more likely to require silanol capping than treatments employing direct UV attack.

If an oxidizing atmosphere is used, the UV wavelengths and intensity will obviously be chosen for photoreaction with oxygen or other oxidizing precursor. For oxygen, wavelengths will generally range between about 173 and 222 nm and light intensity can range between about 1 $\mu W/cm^2$ and 1 $W/cm^2$.

Figure 2:
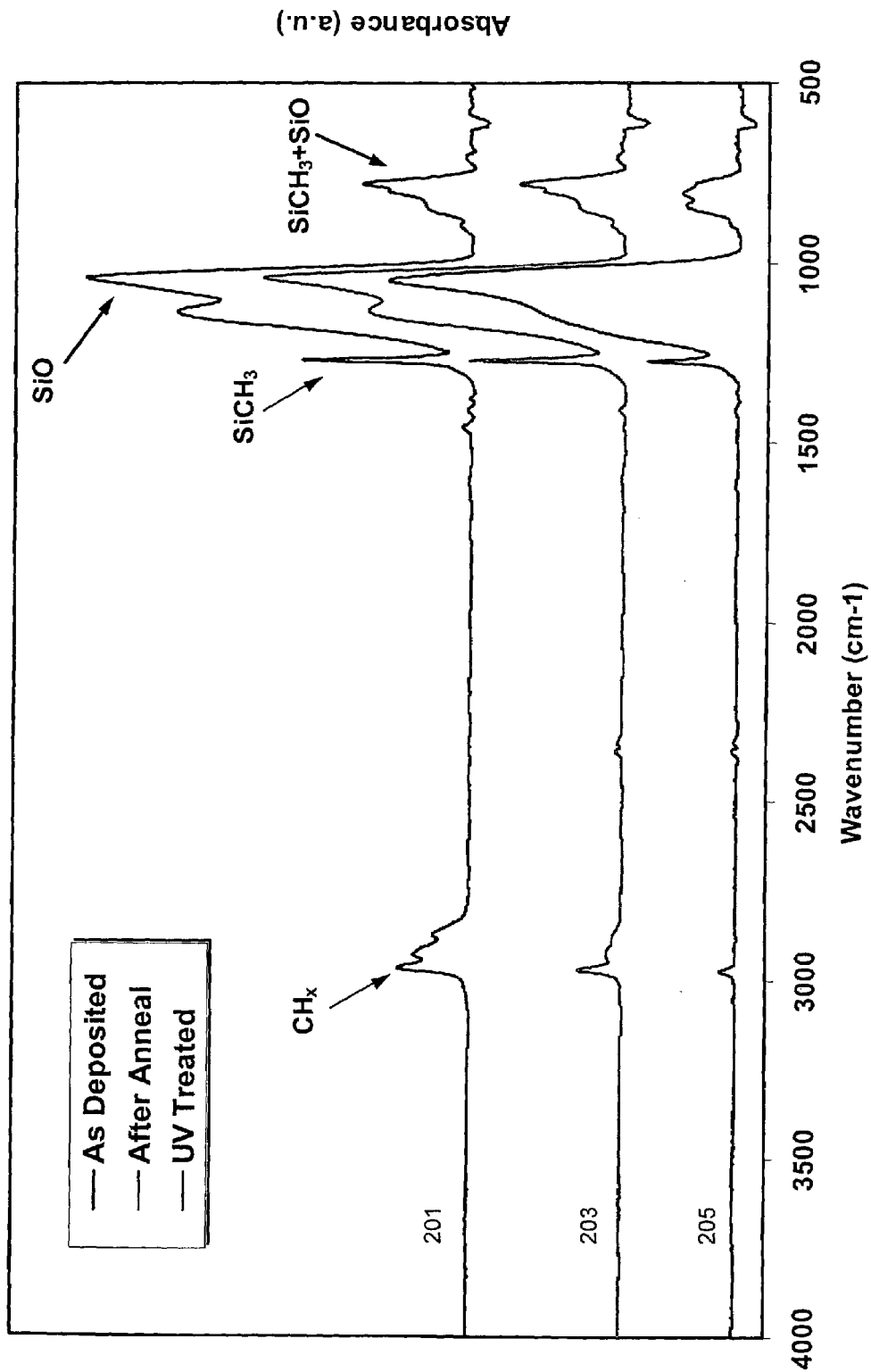
FIG. 2 is a composite graph of three FTIR spectra, one of a precursor film before porogen removal, another of a precursor film after porogen removal using an annealing process showing partial removal of porogen, and the third of a precursor film after porogen removal with UV radiation in accordance with one embodiment of the invention showing complete porogen removal.

FIG. 2 is a composite graph of three FTIR spectra. Spectrum 201 is of an untreated organosilicate glass (OSG) film (i.e., precursor film) deposited from diethoxymethylsilane (DEMS) with ENB as a porogen. Spectrum 203 is an OSG film after an anneal process for 4 hours at 425° C. Spectrum 205 is an OSG film after exposure to a broadband UV light source in an inert vacuum environment (10 mTorr). Spectrum 201 of the untreated OSG film exhibits an absorption peak corresponding to the C—H stretch around 2840 to 3055 $cm^{-1}$ (marked as "$CH_x$"), with the larger peaks indicating that a significant amount of the ENB porogen is incorporated into the OSG matrix. As shown by spectrum 203, after an anneal process, the intensity of the $CH_x$ peak is significantly reduced, indicating a significant amount of porogen removal. Spectrum 205 shows that after UV treatment, the intensity of the $CH_x$ peak is reduced to just a small peak corresponding to the C—H stretch. This small remaining C—H peak after UV treatment is from the $CH_3$ moieties incorporated in the OSG network as $Si(O)_{3/2}(CH_3)$. Thus, most of the $CH_x$ attributed to porogen incorporated during deposition was removed by UV treatment. Note that in the spectra 201, 203 and 205 for all three films, peaks at 1273 $cm^{-1}$ attributed to Si—$CH_3$ bond absorptions and at 1052 $cm^{-1}$ and 1151 $cm^{-1}$ attributed to Si—O bond absorption are also observed. All three spectra also show peaks at 850 $cm^{-1}$, 802 $cm^{-1}$ and 780 $cm^{-1}$, which are attributed to Si—C bond absorption from $Si(CH_3)_3$, $Si(CH_3)_2$ and $Si(CH_3)$, respectively, convoluted with a peak at ~810 $cm^{-1}$ attributed to Si—O bond absorption.

Figure 3A:
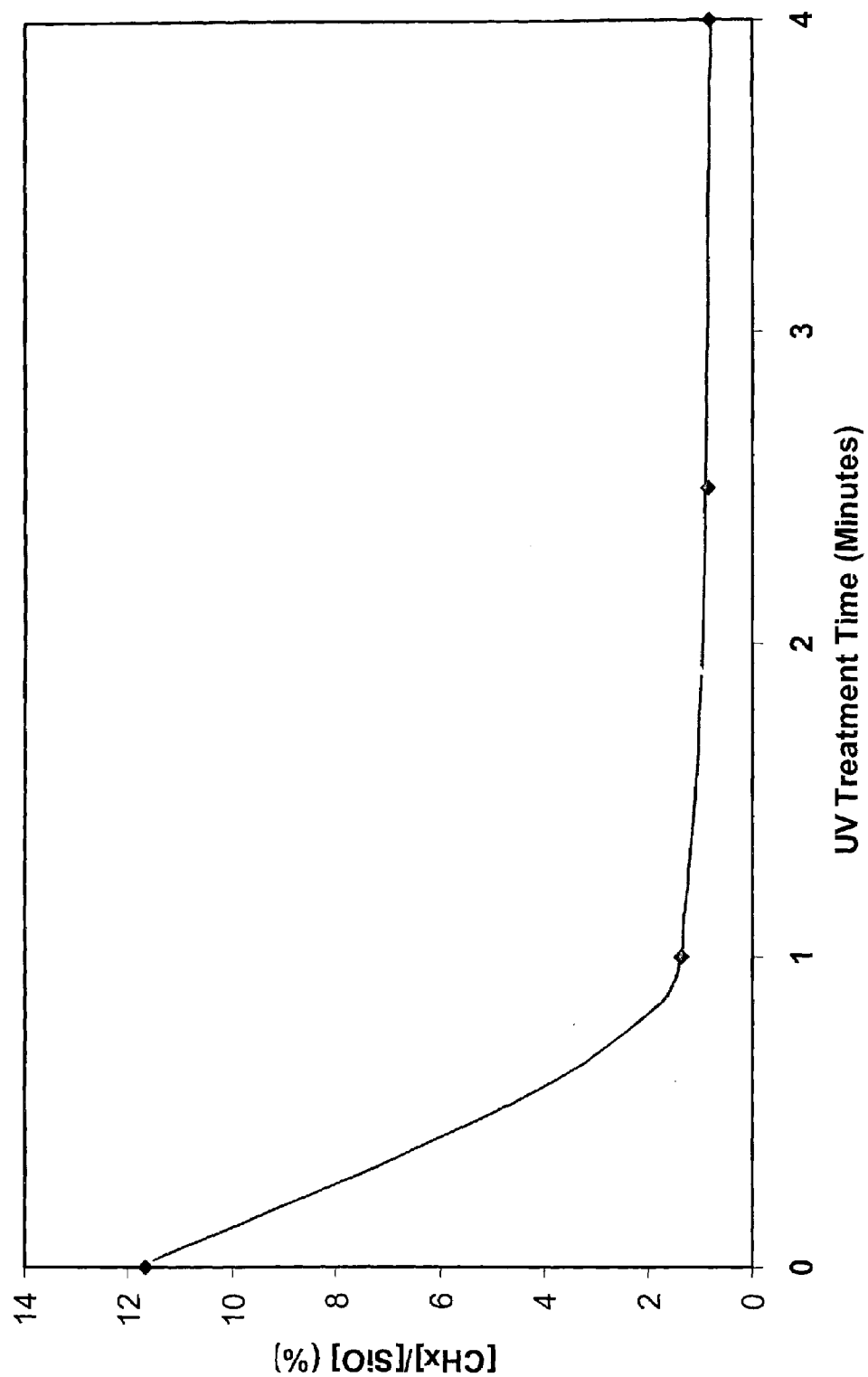
FIG. 3A is a graph representing the ratio of CH and SiO FTIR peak intensities as a function of UV exposure time to demonstrate porogen removal from a precursor film in accordance with the present invention.
Figure 3B:
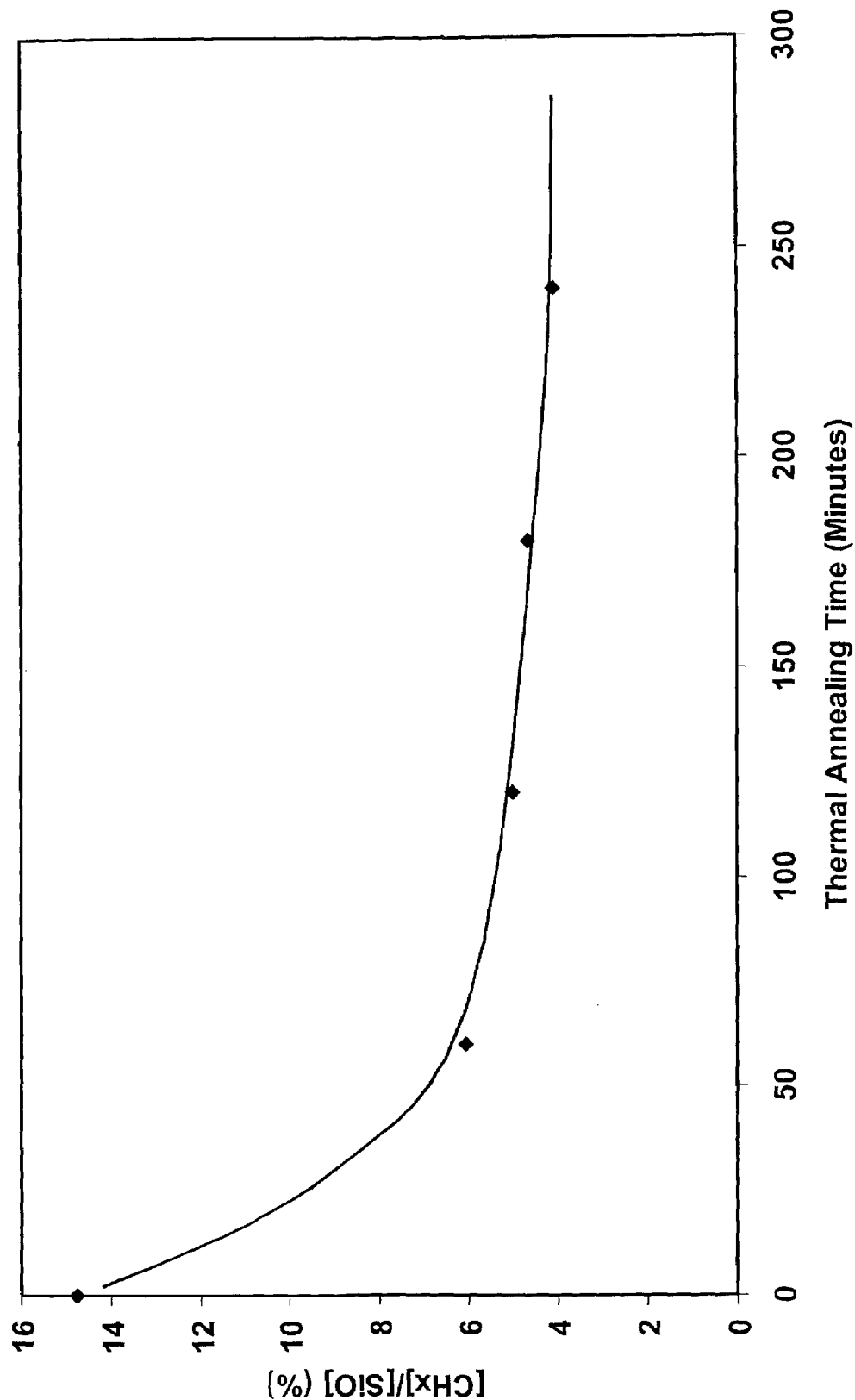
FIG. 3B is a graph representing is a graph representing the ratio of CH and SiO FTIR peak intensities as a function of anneal time to demonstrate porogen removal from a precursor film using an anneal process.

FIG. 3A is a graph demonstrating the efficiency of hydrocarbon removal due to UV treatment as monitored by the FTIR peak ratio of CH (at 2840 to 3055 $cm^{-1}$) and SiO (at 1052 and 1151 $cm^{-1}$) in a precursor film deposited from DEMS and ENB. As shown by the graph, one minute of UV treatment removes greater than about 88% of the porogen. Longer treatment (as shown at 2–4 minutes on graph) continues to reduce the hydrocarbon content. In comparison, FIG. 3B shows similar porogen removal by a thermal anneal at ~425° C. in a $N_2$ environment at about 9 Torr. As indicated by comparisons of FIGS. 3A and 3B, it takes a much longer time for the thermal anneal to remove porogen compared to UV treatment. For example, FIG. 3B shows that only about 40% of the porogen is removed after more than 50 minutes of anneal and that only about 60% of the porogen is removed after about 250 minutes of anneal.

Figure 3C:
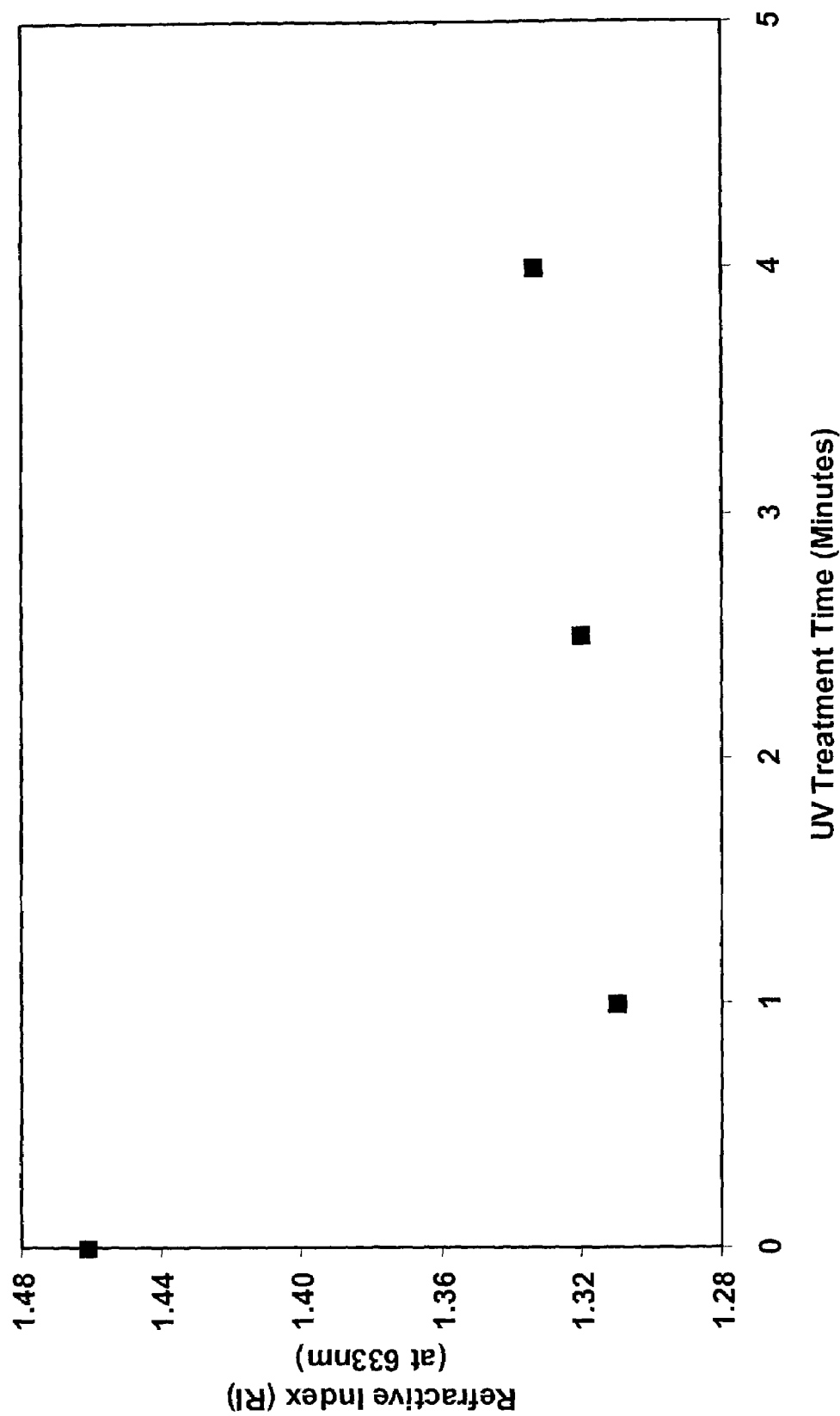
FIG. 3C is a graph representing the change in the refractive index of a precursor film as a function of UV exposure time in accordance with the present invention.

FIG. 3C is a graph showing the change in refractive index (RI) of the precursor film at different UV exposure times. The refractive index is measured by ellipsometry methods at 633 nm. As shown by the graph, the RI of the precursor film before UV exposure is about 1.46. After one minute of UV exposure, the RI drops significantly to about 1.31. This observation confirms the successful removal of the porogen and the creation of pores in the OSG structure. Note that further UV treatment increases RI slightly, as indicated by the RI measurements at UV exposure times of 2.5 and 6 minutes.

Figure 3D:
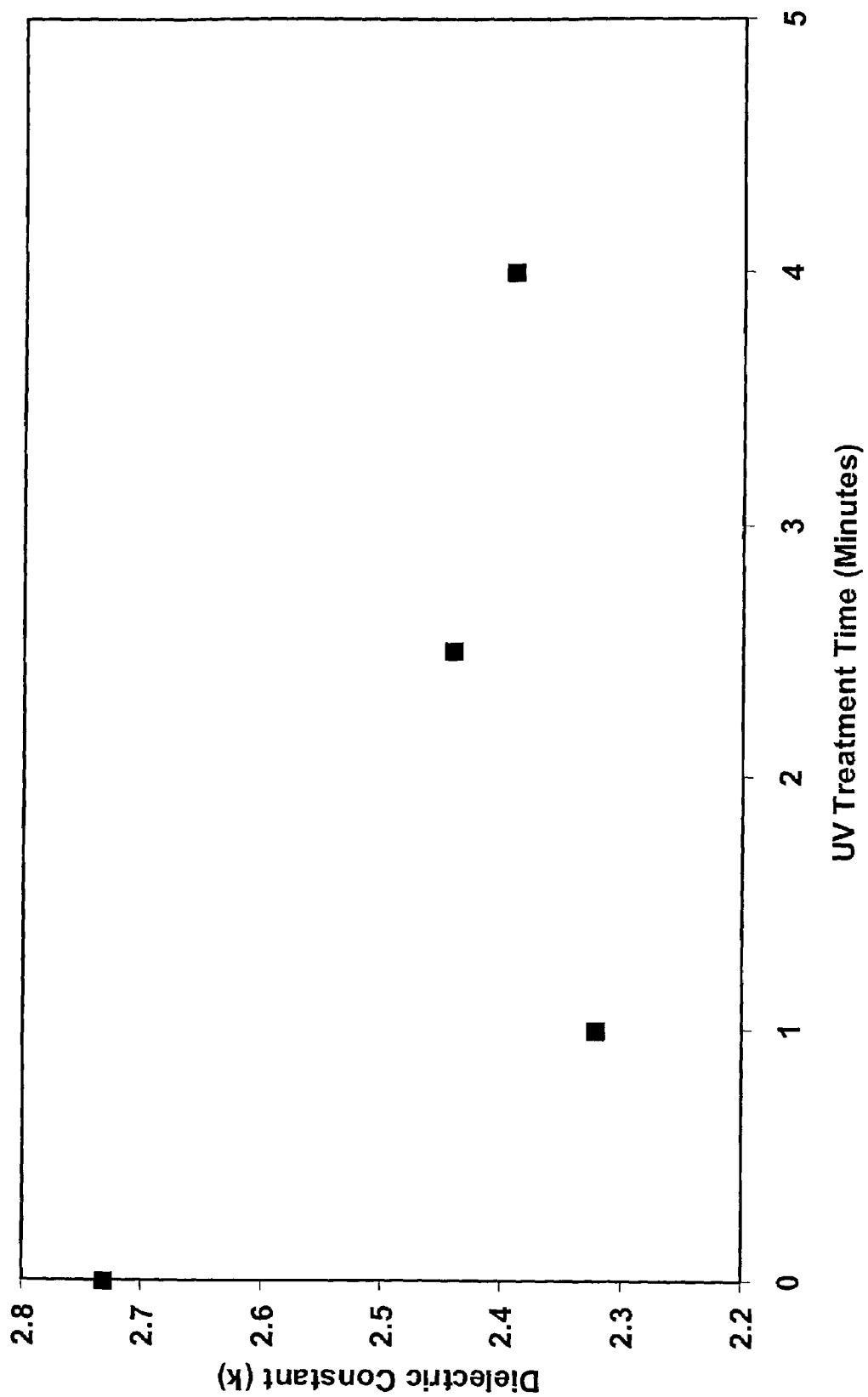
FIG. 3D is a graph representing the change in the dielectric constant of a precursor film as a function of UV exposure time in accordance with the present invention.

FIG. 3D shows the change in the dielectric constant (k) after UV treatment. The k of the precursor film before UV exposure is between 2.7 and 2.8. After only one minute of UV exposure, k drops significantly to between 2.3 and 2.4. The initial porogen removal is again confirmed by the decrease in the dielectric constant. Note that the UV treatment times at 2.5 and 4 minutes show that k fluctuates a little with extended UV treatment times.

Apparatus

The present invention can be implemented in many different types of apparatus. Generally, the apparatus will include one or more chambers (sometimes referred to as process vessels) that house one or more wafers and are suitable for wafer processing. At least one chamber will include a UV source. A single chamber may be employed for all operations of the invention or separate chambers may be used. Each chamber may house one or more wafers for processing. The one or more chambers maintain the wafer in a defined position or positions (with or without motion within that position, e.g. rotation, vibration, or other agitation) during porogen removal and post porogen removal processes such as anneal and silanol capping, if used. For certain operations in which the wafer is to be heated, the apparatus may include a heating platen.

Figure 4:
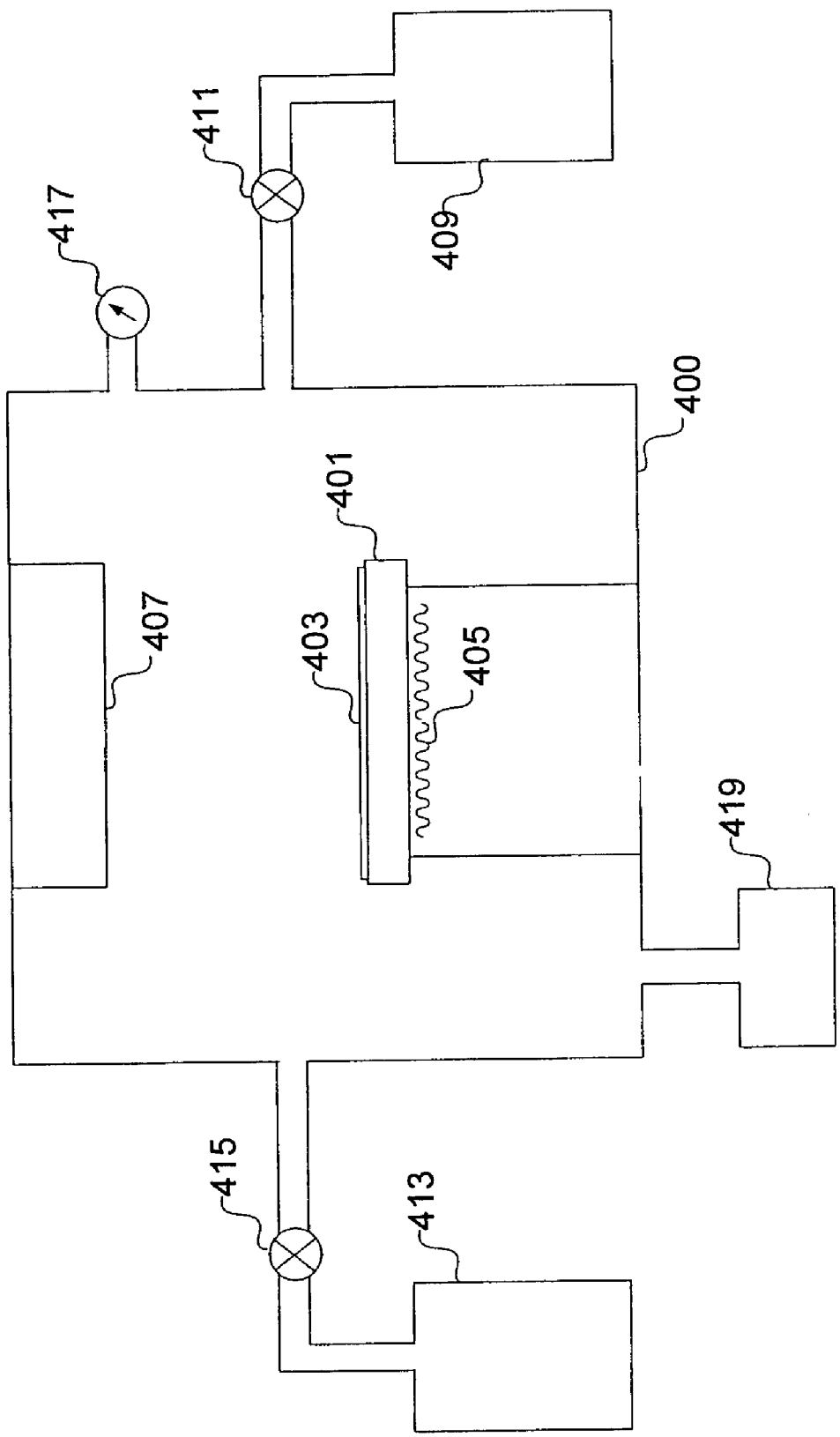
FIG. 4 is a schematic representation of apparatus suitable for UV porogen removal in accordance with certain embodiments of this invention.

FIG. 4 is a schematic diagram of an example chamber system in accordance with the invention. A substrate holder 401 and a UV light source 407 are housed within a chamber 400. In alternate embodiments, the light source may be mounted outside the chamber on a window. Chamber 400 is capable of holding a vacuum and/or containing gases at pressures above atmospheric pressure. Chamber 400 may be one chamber in a multi-chambered system or it may be a stand-alone apparatus. Substrate holder 401 holds substrate 403 such that it can be irradiated with light from UV light source 407. Substrate holder 401 has a heater 405 that can heat the substrate to defined temperatures and can be controlled by a temperature controller (not shown).

UV light source 407 is a xenon lamp or other source of UV radiation of the required characteristics. As indicated above, the UV light source may be a lamp or a laser (not shown), such as an excimer laser, capable of providing intense UV light. In cases where a laser is used, various optical elements may be required to direct the UV light toward portions of the substrate. Methods for directing the laser light at different portions of the substrate at different times will be required as well. In a specific embodiment, the UV source directs UV radiation on the substrate at an intensity of between about 1 $\mu W/cm^2$ and 10 $W/cm^2$ in the range of 200 to 400 nanometers.

Inert gas source 409, such as a nitrogen gas source, can provide inert gas to chamber 400. The amount of inert gas introduced into chamber 400 is controlled by valve 411 and is measured by pressure gauge 417. During normal operation, chamber 400 is first evacuated using vacuum pump 419, and then the inert gas or other gas is introduced to a certain chamber pressure. Next, UV light source 407 is turned on and light is directed onto substrate 403. If an oxygen containing process is employed, oxygen gas source 413 can provide oxygen to chamber 400 controlled by valve 415. Processes involving mixtures of inert gas and oxygen may also be utilized. In cases where UV radiation occurs under vacuum, vacuum pump 419 can be used to pump down chamber 400 and UV irradiation can occur without the introduction of gas.

Note that the apparatus depicted in FIG. 4 is only an example of a suitable apparatus and other apparatuses designed for other methods involved in previous and/or subsequent processes may be used. For example, methods of the invention may be used with a standard PECVD chamber used to deposit the precursor layer if the chamber is equipped with a UV radiation source. Some supercritical fluid chamber systems may also be configured to include a UV radiation source. Many of these systems may also be used to perform the post-porogen removal anneal and/or silanol capping procedures. Obviously, in these cases, the chamber system will likely be pumped out between each of the process steps.

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A method of preparing a porous low-k dielectric material on a substrate, the method comprising:
   forming a precursor film on the substrate, the precursor film comprising a porogen and a structure former;
   exposing the precursor film to ultraviolet radiation to facilitate removing the porogen from the precursor film and thereby create voids within the dielectric material to form the porous low-k dielectric material;
   annealing the porous low-k dielectric material and;
   exposing the porous low-k dielectric material to a silanol capping agent; wherein the exposure to ultraviolet radiation, annealing and exposure to a silanol capping agent take place in a single process vessel.

2. The method of claim 1, wherein the precursor film comprises a porogen and a silicon-containing structure former.

3. The method of claim 1, wherein the precursor film is formed by co-depositing the porogen with the structure former.

4. The method of claim 1, wherein the structure former is produced from at least one of a silane, an alkylsilane, an alkoxysilane and a siloxane.

5. The method of claim 4, wherein the structure former is produced from octamethylcyclotetrasiloxane (OMCTS), tetramethylcyclotetrasiloxane (TMCTS) or a combination thereof.

6. The method of claim 1, wherein the porogen comprises a polyfunctional cyclic non-aromatic compound.

7. The method of claim 6, wherein the polyfunctional cyclic non-aromatic compound is an alpha-terpinene compound.

8. The method of claim 1, wherein the porogen has ordered structure.

9. The method of claim 8, wherein the porogen comprises a mesoporous structure formed from a block copolymer.

10. The method of claim 1, wherein the porogen and structure former exist in one precursor molecule.

11. The method of claim 10, wherein the compound is an organic silane.

12. The method of claim 10, wherein the compound is di-tert-butyl-silane.

13. The method of claim 1, wherein the precursor film is formed by a chemical vapor deposition process.

14. The method of claim 1, wherein the precursor film is formed by a spin-on technique.

15. The method of claim 1, wherein exposing the precursor film to ultraviolet radiation takes place in an inert environment.

16. The method of claim 15, wherein the ultraviolet radiation comprises light with a wavelength at or near an absorption peak of the porogen.

17. The method of claim 15, wherein the inert environment comprises a gas selected from the group consisting of nitrogen, argon, helium and hydrogen.

18. The method of claim 15, wherein the inert environment comprises vacuum conditions.

19. The method of claim 1, wherein exposing the precursor film to ultraviolet radiation takes place in the presence of oxygen.

20. The method of claim 19, wherein the ultraviolet radiation comprises light having a wavelength that produces at least one of ozone and oxygen radicals.

21. The method of claim 1, wherein the substrate temperature during exposure to ultraviolet radiation ranges between about 25 and 450 degrees Celsius.

22. The method of claim 1, wherein the silanol capping agent is selected from the group consisting of disilazanes, chlorosilanes, aldehydes, and combinations thereof.

23. The method of claim 1, wherein the silanol capping agent is HMDS.

24. A method of preparing a porous low-k dielectric material on a substrate, the method comprising:
   forming a precursor film on the substrate, the precursor film comprising a porogen and a structure former;
   exposing the precursor film to ultraviolet radiation to facilitate removing the porogen from the precursor film and thereby create voids within the dielectric material to form the porous low-k dielectric material;
   annealing the porous low-k dielectric material and exposing the porous low-k dielectric material to a silanol capping agent; wherein the annealing and silanol capping steps are performed simultaneously.

25. A method of preparing a porous low-k dielectric material on a partially fabricated integrated circuit, the method comprising:
   providing the partially fabricated integrated circuit to a process chamber, wherein the partially fabricated integrated circuit comprises a precursor film having a porogen and a structure former;
   exposing the partially fabricated integrated circuit to ultraviolet radiation in an inert environment such that the ultraviolet radiation interacts with the porogen to produce a volatile decomposition products; and
   removing the volatile decomposition products from the precursor film, leaving the porous low-k dielectric material on the partially fabricated integrated circuit;
   annealing the porous low-k dielectric material; and
   exposing the porous low-k dielectric material to a silanol capping agent; wherein the exposure to ultraviolet radiation, annealing and exposure to a silanol capping agent take place in a single process vessel.

26. The method of claim 25, wherein the ultraviolet radiation comprises wavelengths ranging between about 156 and 500 nm.

27. The method of claim 25, wherein the inert environment comprises an inert gas.

28. The method of claim 27, wherein inert gas is at least one of nitrogen, argon, helium or hydrogen gas.

29. The method of claim 25, wherein the inert environment comprises vacuum conditions.

30. A method of preparing a porous low-k dielectric material on a partially fabricated integrated circuit, the method comprising:
providing the partially fabricated integrated circuit to a process chamber, wherein the partially fabricated integrated circuit comprises a precursor film having a porogen and a structure former;
exposing the partially fabricated integrated circuit to ultraviolet radiation in an inert environment such that the ultraviolet radiation interacts with the porogen to produce a volatile decomposition products; and
removing the volatile decomposition products from the precursor film, leaving the porous low-k dielectric material on the partially fabricated integrated circuit;
annealing the porous low-k dielectric material; and
exposing the porous low-k dielectric material to a silanol capping agent, wherein the annealing and silanol capping steps are performed simultaneously.

31. A method of preparing a porous low-k dielectric material on a partially fabricated integrated circuit, the method comprising:
providing the partially fabricated integrated circuit to a process chamber, wherein the partially fabricated integrated circuit comprises a precursor film having a porogen and a structure former;
exposing the partially fabricated integrated circuit to ultraviolet radiation in the presence of oxygen to produce oxidizing conditions in which the porogen is oxidized to produce porogen oxidation products, which are removed from the precursor film, leaving the porous low-k dielectric material on the partially fabricated integrated circuit;
annealing the porous low-k dielectric material; and
exposing the porous low-k dielectric material to a silanol capping agent; wherein the wherein the annealing and silanol capping steps are performed simultaneously.

32. The method of claim 31, wherein the ultraviolet radiation directly interacts with the porogen to produce volatile decomposition products, thereby facilitating removal of the porogen from the precursor film.

33. The method of claim 31, wherein the oxidizing conditions comprise at least one of ozone and oxygen radicals.

34. The method of claim 31, wherein the ultraviolet radiation comprises light at a wavelength that produces at least one of ozone and oxygen radicals.

35. The method of claim 34, wherein the ultraviolet radiation comprises wavelengths ranging between about 156 and 500 nm.

36. The method of claim 31, further comprising exposing the porous low-k dielectric material to a dehydroxylation agent.

37. The method of claim 31, wherein the silanol capping agent is selected from the group consisting of disilazanes, chlorosilanes, aldehydes, and combinations thereof.

38. The method of claim 31, wherein the silanol capping agent is HMDS.

* * * * *